United States Patent
Kwa

(10) Patent No.: US 8,330,224 B2
(45) Date of Patent: Dec. 11, 2012

(54) INTEGRATED MEMS AND ESD PROTECTION DEVICES

(75) Inventor: Tom Kwa, San Jose, CA (US)

(73) Assignee: Meggitt (San Juan Capistrano), Inc., San Juan Capistrano, CA (US)

( * ) Notice: Subject to any disclaimer, the term of this patent is extended or adjusted under 35 U.S.C. 154(b) by 204 days.

(21) Appl. No.: 12/883,882

(22) Filed: Sep. 16, 2010

(65) Prior Publication Data

US 2011/0068421 A1    Mar. 24, 2011

Related U.S. Application Data

(60) Provisional application No. 61/243,611, filed on Sep. 18, 2009.

(51) Int. Cl.
*H01L 29/739* (2006.01)

(52) U.S. Cl. ........ 257/351; 257/350; 257/761; 257/618; 361/56; 361/118

(58) Field of Classification Search .................. 257/351, 257/350, E21.476, E49.001, 416, 415, E29.324, 257/758, 761, 618; 361/56, 118
See application file for complete search history.

(56) References Cited

U.S. PATENT DOCUMENTS

| | | | |
|---|---|---|---|
| 4,065,970 A | 1/1978 | Wilner | |
| 8,000,068 B2 * | 8/2011 | Brown et al. | 361/56 |
| 2002/0014673 A1 | 2/2002 | Leedy | |
| 2006/0272383 A1 | 12/2006 | Huang et al. | |
| 2007/0190747 A1 * | 8/2007 | Humpston et al. | 438/460 |
| 2008/0268620 A1 | 10/2008 | Floyd | |
| 2009/0190284 A1 | 7/2009 | Konishi et al. | |
| 2009/0261416 A1 * | 10/2009 | Raberg et al. | 257/351 |
| 2010/0171145 A1 | 7/2010 | Morgan et al. | |
| 2011/0147939 A1 * | 6/2011 | La Tulipe et al. | 257/758 |

* cited by examiner

*Primary Examiner* — Michael Shingleton

(74) *Attorney, Agent, or Firm* — Paul Davis; Goodwin Procter LLP

(57) ABSTRACT

An electronic apparatus is provided that has a core, an electronic circuit in the core and a lid. An ESD protection device is in the lid. The ESD protection device is coupled to the electronic circuit.

13 Claims, 13 Drawing Sheets

Fig. 7(b) (Only half of quad diode shown)
Oxidation, photomask "Diffusion", oxide etch, boron diffusion Fig. 7(c) Oxide strip, oxidation, drive-in

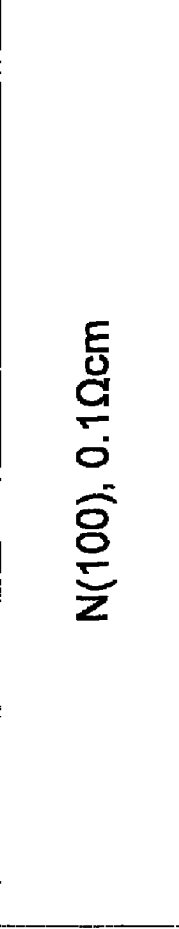
Fig. 9(a) N(100), 0.1Ωcm
Fig. 9(b) Oxidation, photomask "Diffusion", oxide etch, boron diffusion (Only half of quad diode shown)
Fig. 9(c) Oxide strip, oxidation, drive-in
Fig. 9(d) Photomask "KOH", oxide etch

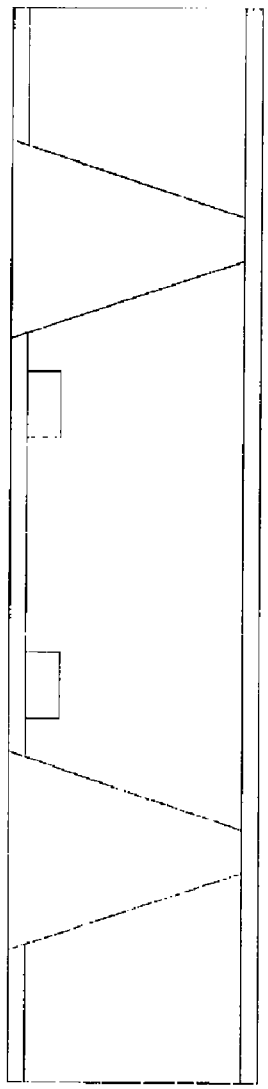
Fig. 9(e) KOH etch
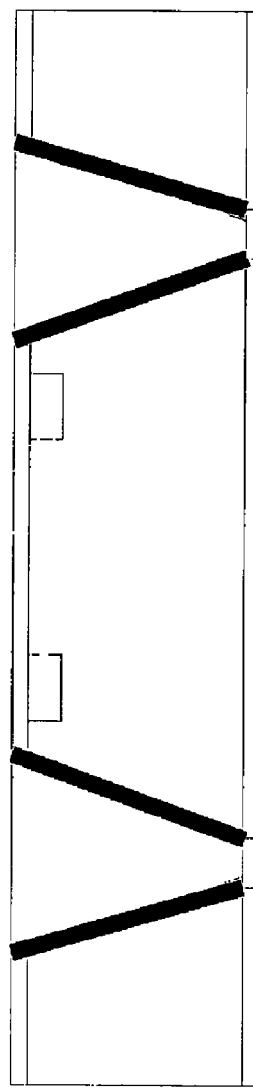
Fig. 9(f) Oxide strip, oxidation
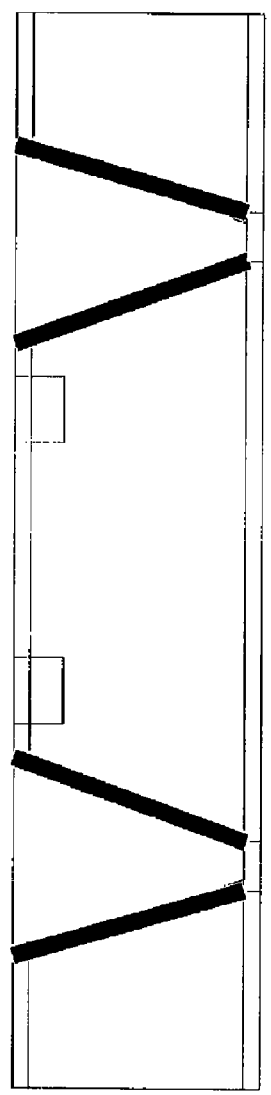
Fig. 9(g) Photomask "Contact", oxide etch

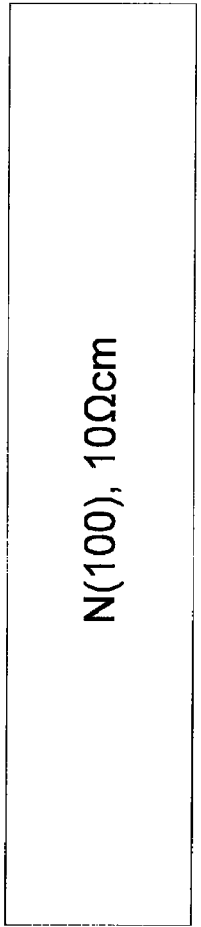
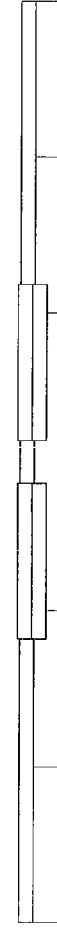
Fig. 10(a) N(100), 10Ωcm
Fig. 10(b) Oxidation, photomask "Diffusion", oxide etch
Fig. 10(c) Boron diffusion, oxide strip, oxidation, drive-in
Fig. 10(d) Photomask "Implant", oxide etch, ion implant

INTEGRATED MEMS AND ESD PROTECTION DEVICES

CROSS-REFERENCE TO THE RELATED APPLICATION

This application claims the benefit of U.S. Ser. No. 61/243,611 filed Sep. 18, 2009, which application is fully incorporated herein by reference.

BACKGROUND

1. Field of the Invention

This invention relates generally to electronic devices sensitive to electrostatic discharge (ESD), and more particularly to MEMS devices integrated with ESD protection device.

2. Related Art

Any electronic device is sensitive to electrostatic discharge (ESD). One method of protecting from ESD is to use an ESD protection diode that functions as a bypass. ESD protection devices such as Zener diodes, have been built in parallel with the electronic device to be protected. If the voltage across the protected device becomes too high, the Zener diode will act as a short and prevent current from going through the ESD sensitive electronic device.

Zener diodes can be used to regulate the voltage across a circuit. When connected in parallel with a variable voltage source so that it is reverse biased, a Zener diode conducts when the voltage reaches the diode's reverse breakdown voltage. From that point it keeps the voltage at that value. A Zener diode is a diode that permits current in the forward direction like a normal diode, but also in the reverse direction if the voltage is larger than the breakdown voltage known as the Zener voltage.

Zener diodes contain a heavily doped p-n junction allowing electrons to tunnel from the valence band of the p-type material to the conduction band of the n-type material. In the atomic scale, this tunneling corresponds to the transport of valence band electrons into the empty conduction band states; as a result of the reduced barrier between these bands and high electric fields that are induced due to the relatively high levels of dopings on both sides. A reverse-biased Zener diode will exhibit a controlled breakdown and allow the current to keep the voltage across the Zener diode at the Zener voltage. For example, a diode with a Zener breakdown voltage of 10 V will exhibit a voltage drop of 10 V if the reverse bias voltage applied across it is more than its Zener voltage.

The breakdown voltage can be controlled quite accurately by the doping process. While tolerances within 0.05% are available, the most widely used tolerances are 5% and 10%.

In many MEMS devices, including but not limited to piezoresistive accelerometer and pressure sensor devices, the ESD protection device is not built into the device to be protected. With certain MEMS devices the ESD protection device is added during the manufacturing of the product as a separate device with the MEMS device. This results in two discrete components. Until these two discrete components are connected the MEMS device remains unprotected.

Accordingly, there is a need to integrate those two at the fabrication level.

SUMMARY

An object of the present invention is to provide MEMS devices with integrated ESD devices.

Another object of the present invention is to provide MEMS devices with an ESD device included as an integrated device.

A further object of the present invention is to provide MEMS devices with higher yields at the assembly level.

Yet another object of the present invention is to provide a MEMS device that has ESD protection from the very start of its fabrication and at all times thereafter.

Another object of the present invention is to provide MEMS devices which have reduced yield loss due to ESD damage.

A further object of the present invention is to provide MEMS devices with lower unit costs.

Yet another object of the present invention is to provide ESD protection of a MEMS device starting from as early as the wafer-level rather than from the die level or when the MEMS device is packaged.

Still another object of the present invention is to provide for the integration of ESD protection with a MEMS device, resulting in a reduced footprint compared to two separate devices.

Another object of the present invention is to provide integration of ESD protection with a MEMS device to eliminate the need to connect the two with connecting wires, solder and the like which may fail due to mechanical shock, thermal stresses, corrosion and the like.

These and other objects of the present invention are achieved in a MEMS system with a base, a semiconductor core including a MEMS device, an electronic circuitry in the core and a lid. An ESD protection device is coupled to the lid and to the electronic circuitry, wherein the ESD protection device is integrated with the MEMS device.

BRIEF DESCRIPTION OF THE DRAWINGS

FIGS. 5(a) through 5(d) illustrate an embodiment of the present invention with wire bonding to connect the MEMS device with the ESD protection device.

FIGS. 7(a) to 7(c) illustrate one embodiment of a fabrication process for the diodes used as the ESD protection device of the present invention.

FIG. 9(a) through 9(g) illustrate one method of making the integrated MEMS device and ESD protection device of the present invention.

FIGS. 10(a) through 10(g) illustrate a specific fabrication process for a piezoresistive MEMS system of the present invention.

DETAILED DESCRIPTION

Figure 1:
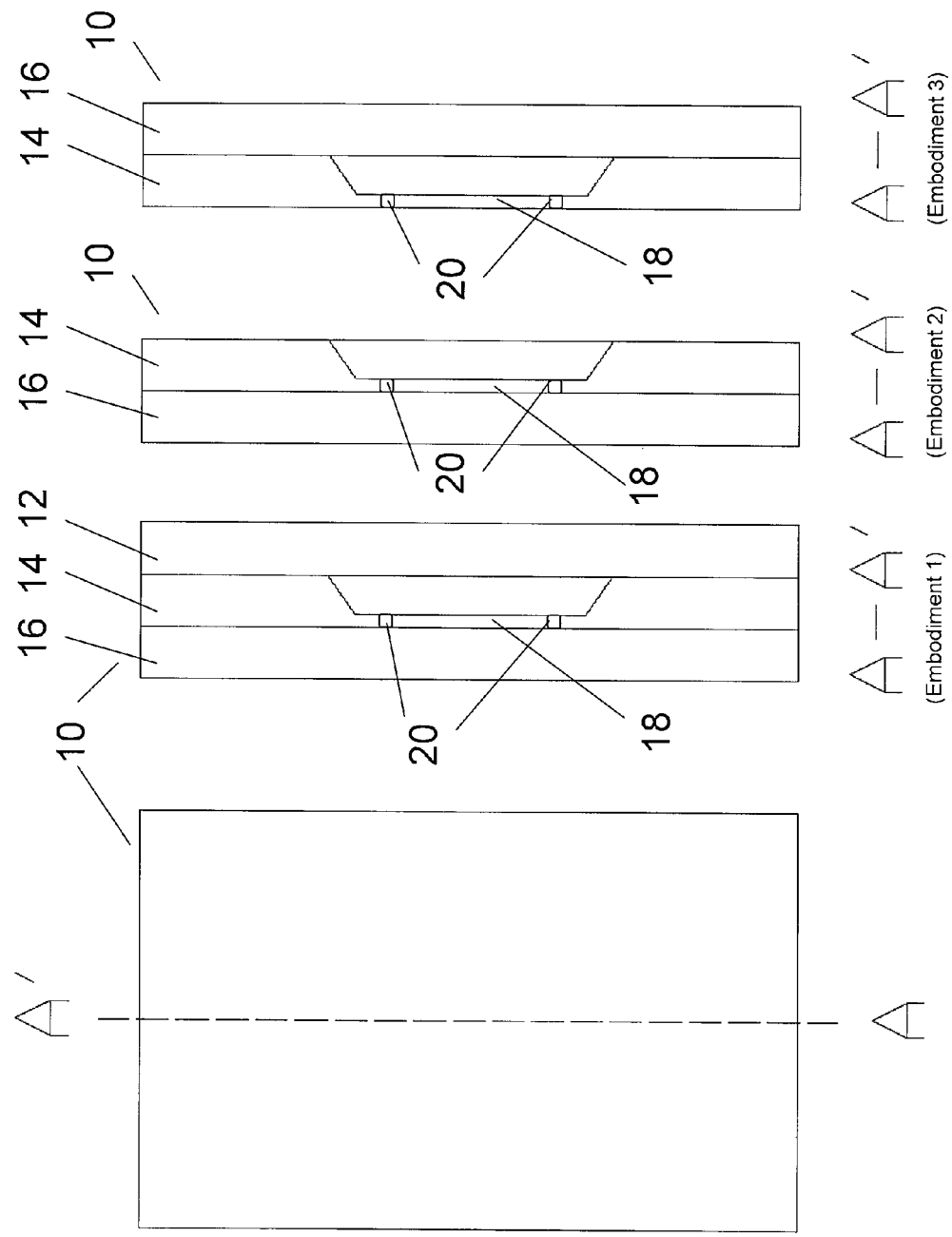
FIG. 1 illustrates one (not three?) embodiment of the present invention showing MEMS devices with integrated ESD protection devices.
Figure 2:
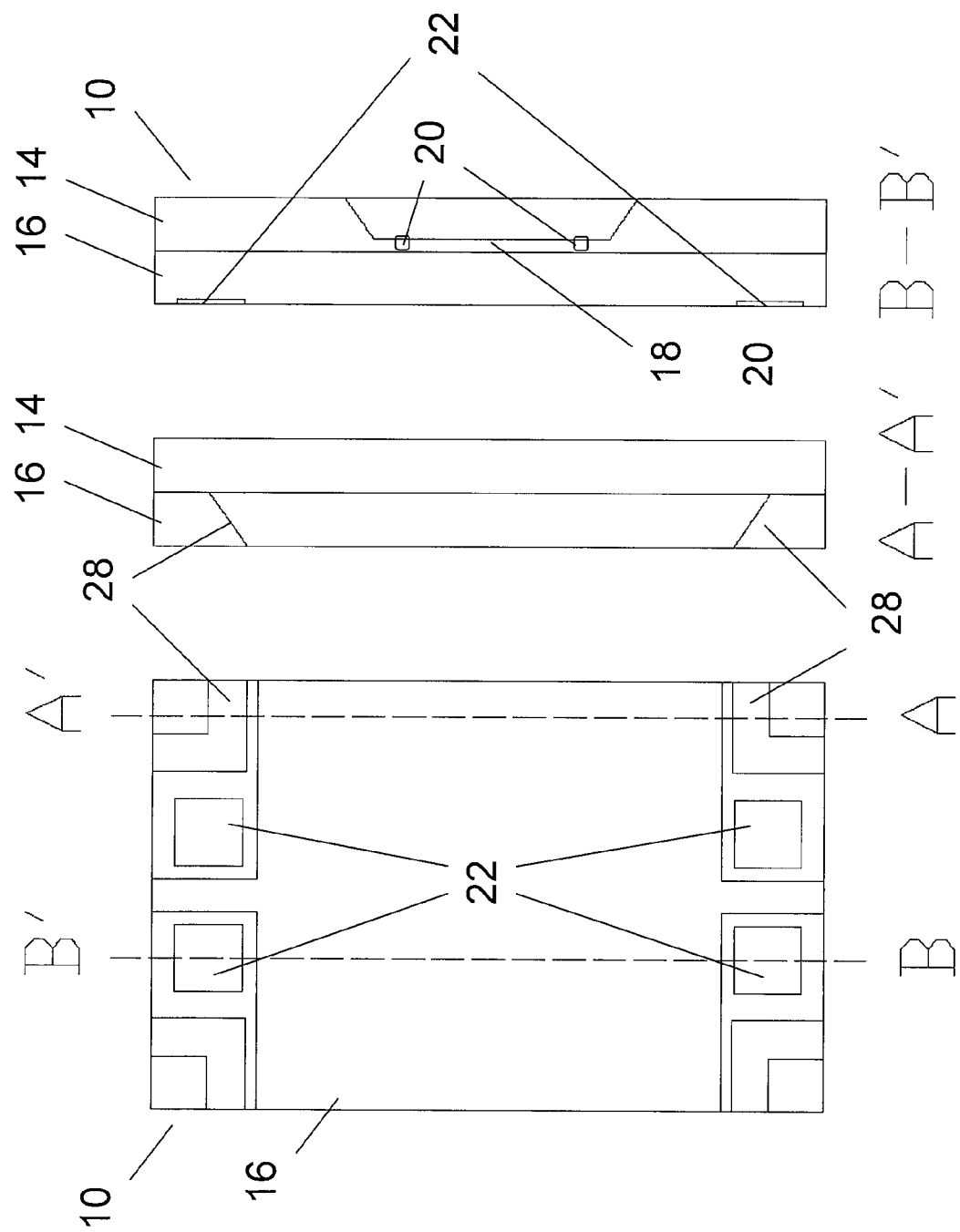
FIG. 2 illustrates an embodiment where the ESD protection device is included in the lid of the MEMS device.

In one embodiment of the present invention, illustrated in FIG. 1, a MEMS system 10 is provided that can include a base 12, a semiconductor core 14 and a lid 16. The semiconductor core 14 can include a MEMS device 18 including but not limited to a sensor 18, an actuator, electronic circuitry and the like, as more fully described hereafter. The present invention can be applied to other devices including but not limited to, integration of signal conditioning and other electronic circuitry. Examples of electronic circuitry include but are not limited to, trim resistor networks, amplifiers, filters, A/D converters, ASICs, DSPs, microprocessors and the like, as more fully described hereafter. An electronic circuit 20 is coupled to and can be in the semiconductor core 14. An ESD protection device 22 is coupled to the lid 16 and to the electronic circuit 20. The ESD protection device 22 can be included in the lid as illustrated in FIG. 2.

With the present invention, the MEMS device 18 is integrated with the ESD protection device 22. This provides for, higher yields at the assembly level, ESD protection from the very start of the MEMS device fabrication and at all times thereafter, reduced yield loss due to ESD damage, and lower unit costs. ESD protection is provided at the wafer-level rather than at the die level or in the packaging. By integrating the MEMS device with the ESD protection device, there is a reduced footprint, and there is no need to connect the two with connecting wires, solder and the like.

Figure 3:
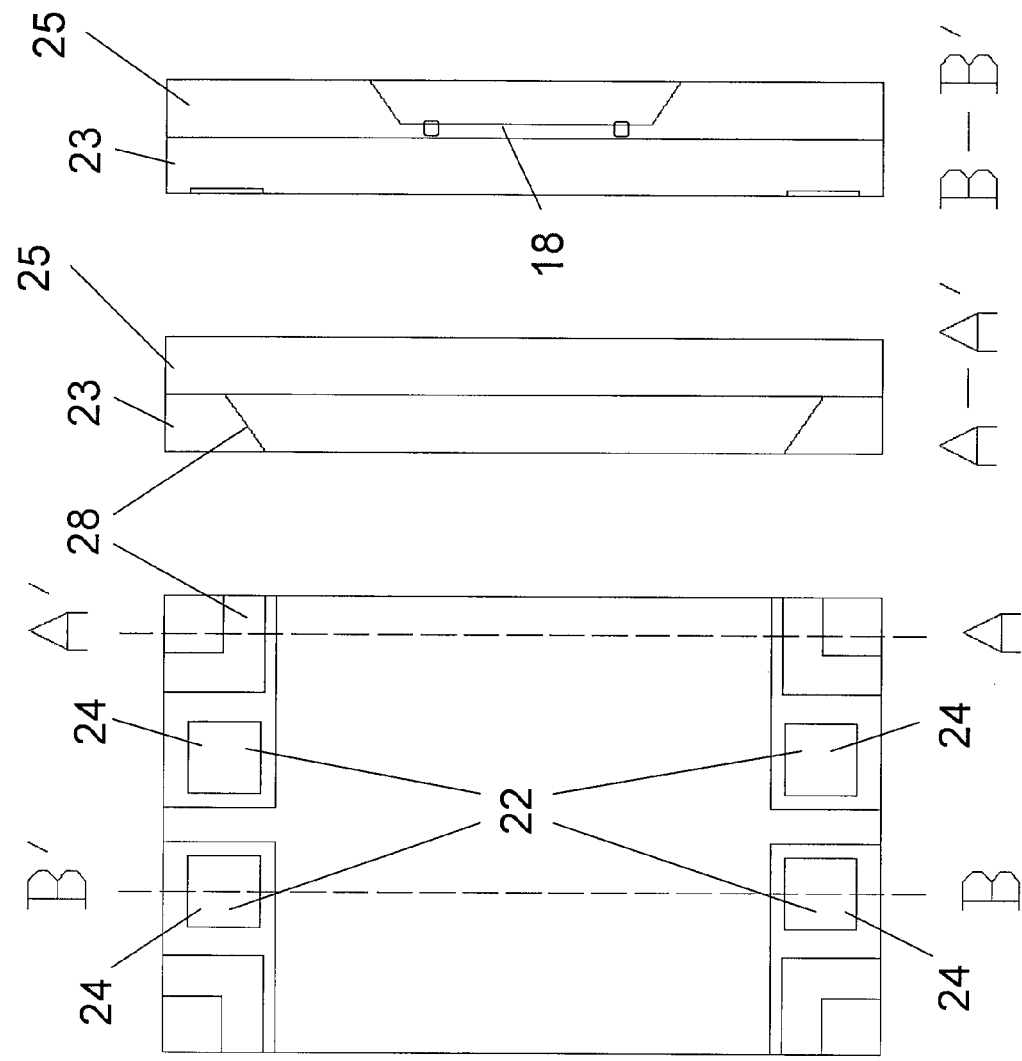
FIG. 3 illustrates an embodiment of the present invention where a quad of diodes is used as the ESD protection device.

In one specific embodiment, the ESD protection device 22 is one or more diodes 24 as shown in FIG. 3. FIG. 3 illustrates a quad of diodes 24 used as the ESD protection device 22. A diode/cover wafer 23, and a MEMS/sensor wafer 25 are provided. Quad diodes are configured similar to (or more accurately, complementary to) a Wheatstone bridge with resistors configured in a bridge which it is intended to protect against ESD damage. The advantage/purpose of such a configuration is that each of the four bridge terminals is connected to its protective diode. The four diodes have a common point to which the ESD energy is diverted.

Figure 4:
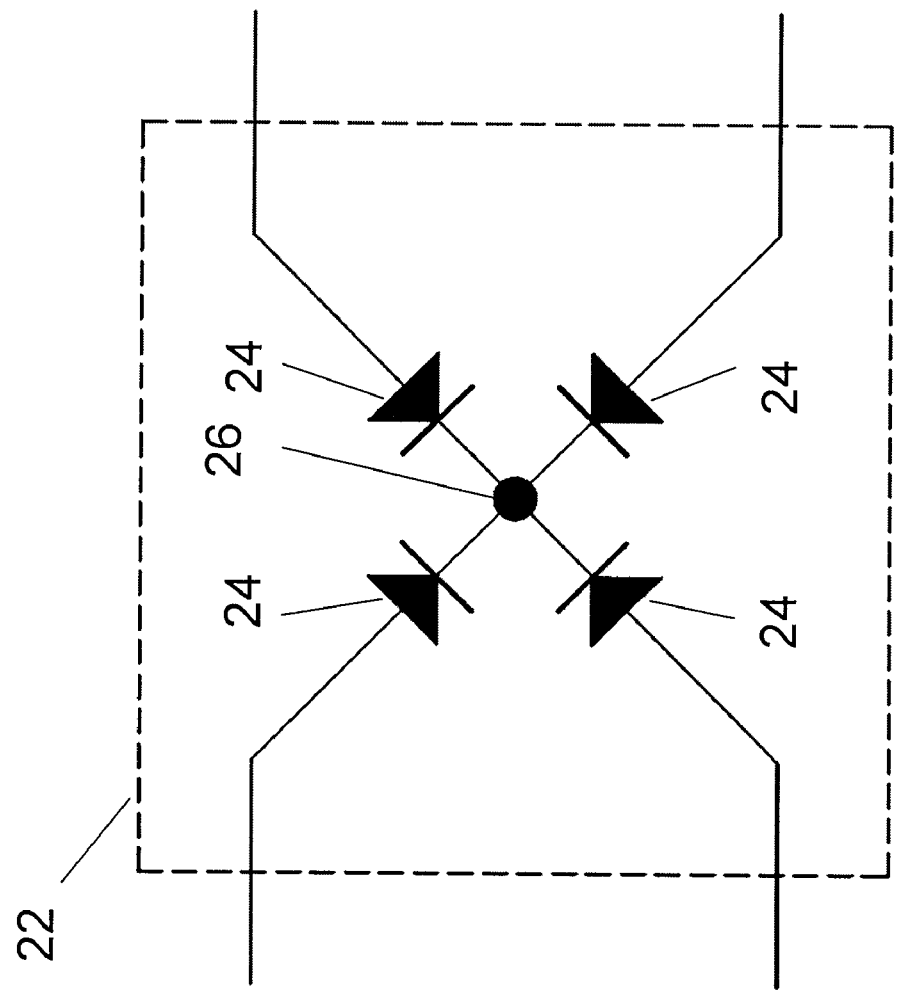
FIG. 4 illustrates an embodiment of the present invention where four diodes, such as four p-n junction diodes are connected at a common point.

In one embodiment, four diodes 24 are used. In one embodiment, four p-n junction diodes 24 are connected together at one end to a common point 26, as illustrated in FIG. 4. In FIG. 4, four diodes, such as four p-n junction diodes 24 are connected at a common point. Each diode is to be coupled to a terminal of the MEMS device. It will be appreciated that the protected device 10 need not be diodes. The MEMS device 18 is in the core, and the ESD protection device 22 is in the lid 16. The MEMS device 18 can have gauges in the semiconductor core 14.

Vias 28 are formed in the lid 16 with metal in the vias 28. The metal couples the ESD protection device 22 with the electronic circuit 20 of the semiconductor core 14.

In one embodiment, the present invention can also be employed for lower-level uses. One such use is trimming of zero offset which, including but not limited to ESD protection, which has been done with the addition of discrete components.

Instead of or in addition to the diodes 24, resistors can be added to allow for zero offset trimming. In the most complex form, an entire signal conditioning circuit, such as one including amplifiers, one or more filters, ND converters and the like, can be fabricated into the cover 16 (or lid) wafer.

Suitable sensors 18 include but are not limited to, piezoresistive pressure sensors, accelerometers, inclinometers, geophones, microphones, gyroscopes, flow sensors, displacement sensors, force sensors, torque sensors, stress and strain sensors.

Figures 5A, 5B, 5C, 5D:
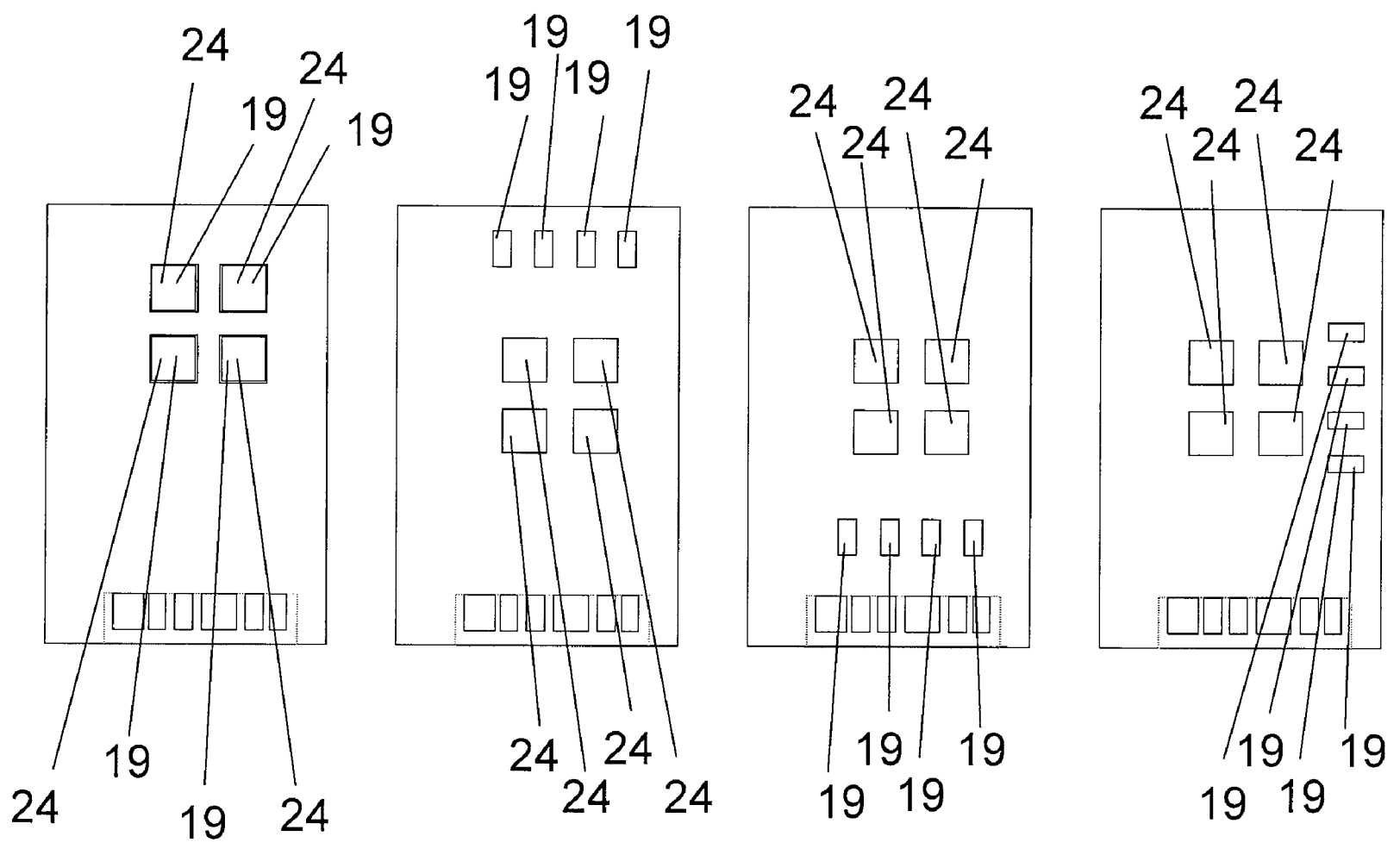

FIGS. 5(a) through 5(d) illustrate embodiments where wire bonding is required to connect the MEMS device 18 with the ESD protection device 22. In FIG. 5(a), the diodes 24 and pads 19 are not separated. In FIGS. 5(b) through 5(d) the two are separated. One advantage of the present invention is simplicity in manufacturing in that a step to connect the metal from top to bottom is eliminated. When dice are stacked they are commonly connected using wires that connect the metal pads of the devices in the top layer to the metal pads of the devices in the layer below. Alternatively, wires from the top layer are connected to a printed-circuit board and wires from the layer below are connected to the same printed-circuit board and connections between the corresponding pads are then made on the printed-circuit board. In the present invention, having the devices in the top connected to the devices in the layer below by means of a single metal layer gives the flexibility to locate where the electrical connections will be made to the device 10, which can then be top, bottom or both. The contact pads 19 can be placed wherever convenient to bond or solder to, either from the core level or from the lid level to the substrate or circuit board.

The devices of FIGS. 5(a) to 5(d) eliminate having separate MEMS devices 18 and ESD protection devices 22. However, these embodiments do not provide protection right away. As long as there is no electrical connection between the diodes in the top layer and the gauges in the layer below, the diodes do not provide ESD protection to the gauges. This connection is commonly made using wires as described above, but only after the wafer has been diced. In the present invention, the connection is made, while still in wafer form, as soon as metal is deposited that makes an connection between the MEMS and the diodes giving instantaneous ESD protection.

Figure 6:
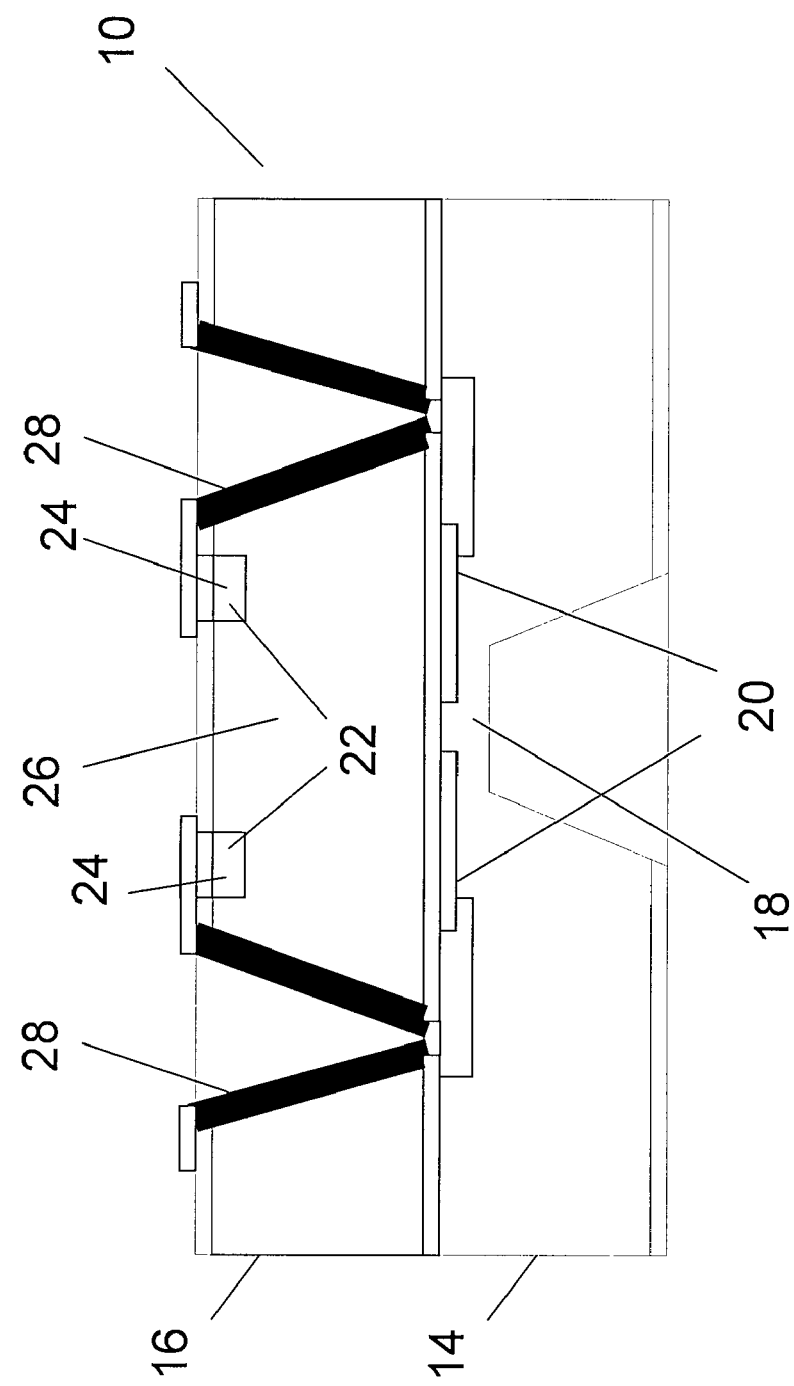
FIG. 6 illustrates the FIG. 1 embodiment with the semiconductor core and the lid, with the base left off.

FIG. 6 shows the semiconductor core 14 and the lid 16, with the base 12 left off. Only half of the quad diode device 22 is illustrated. The MEMS device 18 can be a pressure sensor 18, as disclosed in U.S. Pat. No. 4,065,970, incorporated herein by reference. In this embodiment, a MEMS process and an ESD protection device 22 process are used. In this embodiment, vias 28 are formed in the lid 16, metal is then deposited that connects the ESD protection device 22 with the sensor 18 in the semiconductor core 14. In one embodiment, the sensors 18 include gauges and the ESD protection device 22 is connected to the gauges. Instant protection is created when the core and the lid are bonded together and electrically connected.

FIGS. 7(a) to 7(c) describe a fabrication process of the diodes 24. They are simply areas of high boron doping (>5E18/cm3) in a low resistivity (<0.2 Ohm-cm) n-type silicon substrate.

Figure 8:
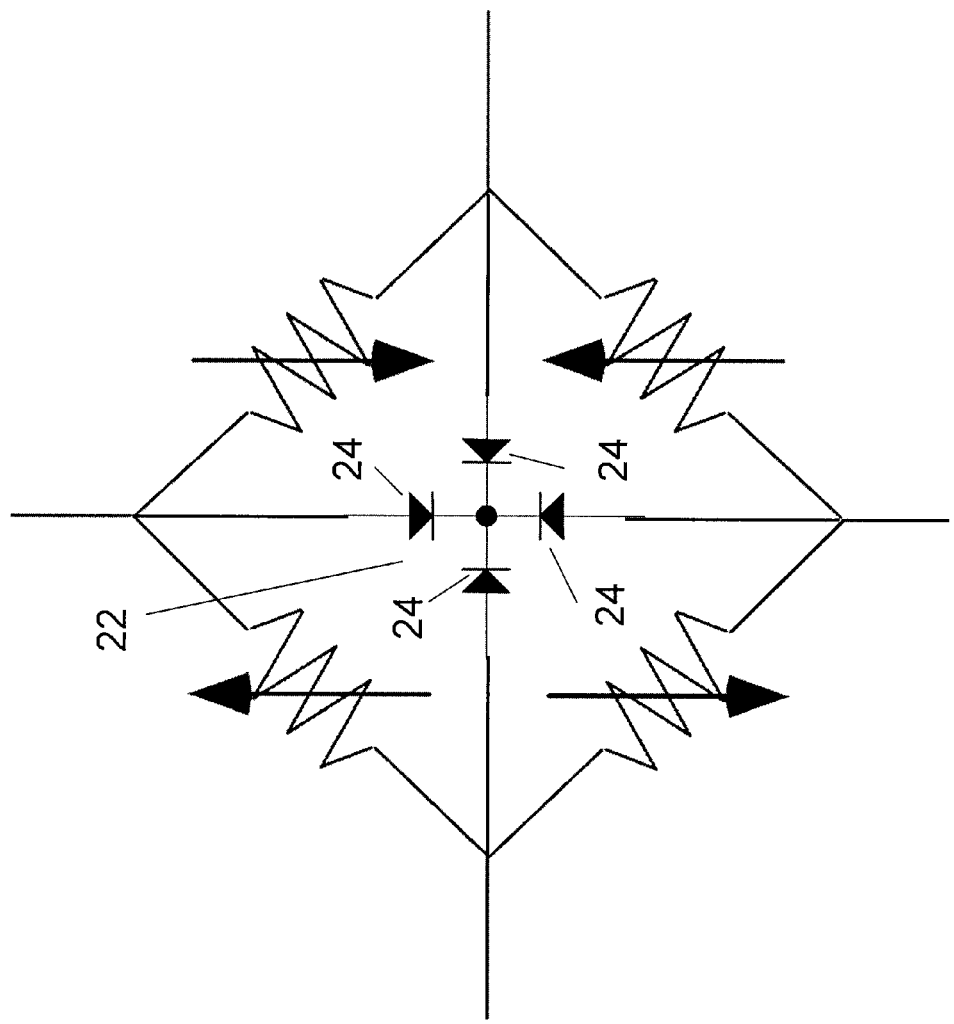
FIG. 8 illustrates an embodiment of an ESD protective quad diode of the present invention integrated with a piezoresistive wheatstone bridge.
Figure 10E:
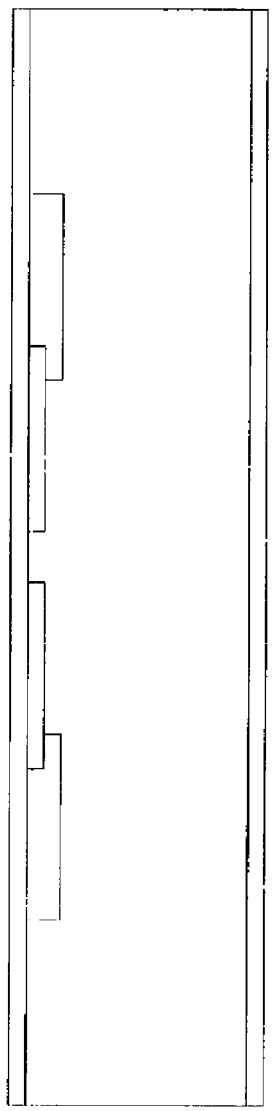
Figure 10F:
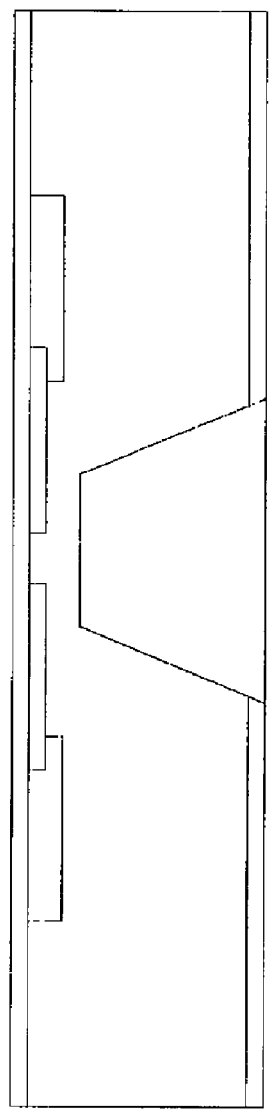
Figure 10G:
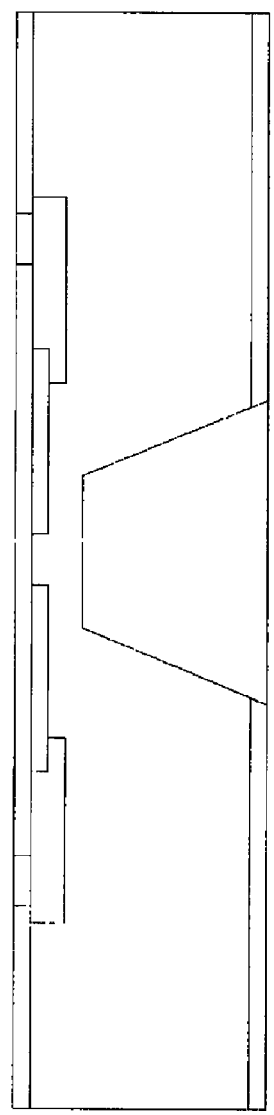

FIG. 8 illustrates an embodiment of the present invention with four gauges an a thumb point where all are connected. FIG. 8 illustrates an embodiment of an ESD protective quad diode 22 integrated with a piezoresistive Wheatstone bridge, as disclosed in U.S. Pat. No. 4,065,970, incorporated herein by reference. In another embodiment, the diodes 24 point outward in which case the diffused areas are N-type inside a P-type well or P-type substrate.

FIG. 9(a) through 9(g) illustrate one method of forming the FIG. 4 structure. An initial substrate of N-type (100) silicon is provided, followed by a first step that includes, an oxidation, a photomask for diffusion, an oxide etch and a boron diffusion. Then an oxide strip, an oxidation and a drive-in is performed. This is followed by a photomask for an anisotropic silicon etch, which by way of illustration and without limitation can be a KOH etch, and an oxide etch. An etch is used to make the vias 28, followed by an oxide strip, an oxidation, a photomask for contact, and an oxide etch. The result is a quad diode 22, or diode quad, which is now ready for bonding to the sensor wafer. Only half of the quad diode 22 is illustrated in FIGS. 9(a) through 9(g). It will be appreciated that other materials and parameters can be utilized.

Other etchants known in the art can also be utilized, as well as deep reactive-ion etching (DRIE) of silicon.

FIGS. 10(a) through 10(g) illustrate a specific fabrication process for a piezoresistive MEMS system 10. A wafer is provided. It can be any semiconductor material, particularly silicon, silicon carbide, SOI and the like. The wafer is then treated to an oxidation, a photomask for diffusion and an oxide etch, creating windows in the oxide. This is followed by a boron diffusion, an oxide strip, a second oxidation and drive-in to create the electrical leads to the piezoresistive gauges. The next series of steps in the fabrication is a photomask for implant, an oxide etch and an ion implant, creating the gauges. These steps create the electrical part, which by way of illustration can be a piezoresistive bridge of the pressure sensor 18. FIGS. 10(a) through 10(g) illustrate only half of the bridge. In one embodiment, the oxidations are done at temperatures between 800 and 1200° C. Boron diffusion is done at temperatures between 1000 and 1200° C. Ion implant is in the range 1E15 to 1E16/cm2 at 30 to 60 keV.

The next steps in the fabrication include an oxidation and annealing. This is followed by a photomask for anisotropic silicon etch, an oxide etch, and an anisotropic silicon etch, creating the mechanical part, a diaphragm, of the pressure sensor 18. Finally, a photomask for contact is used and an oxide etch creates windows to connect the gauges to.

Figure 11:
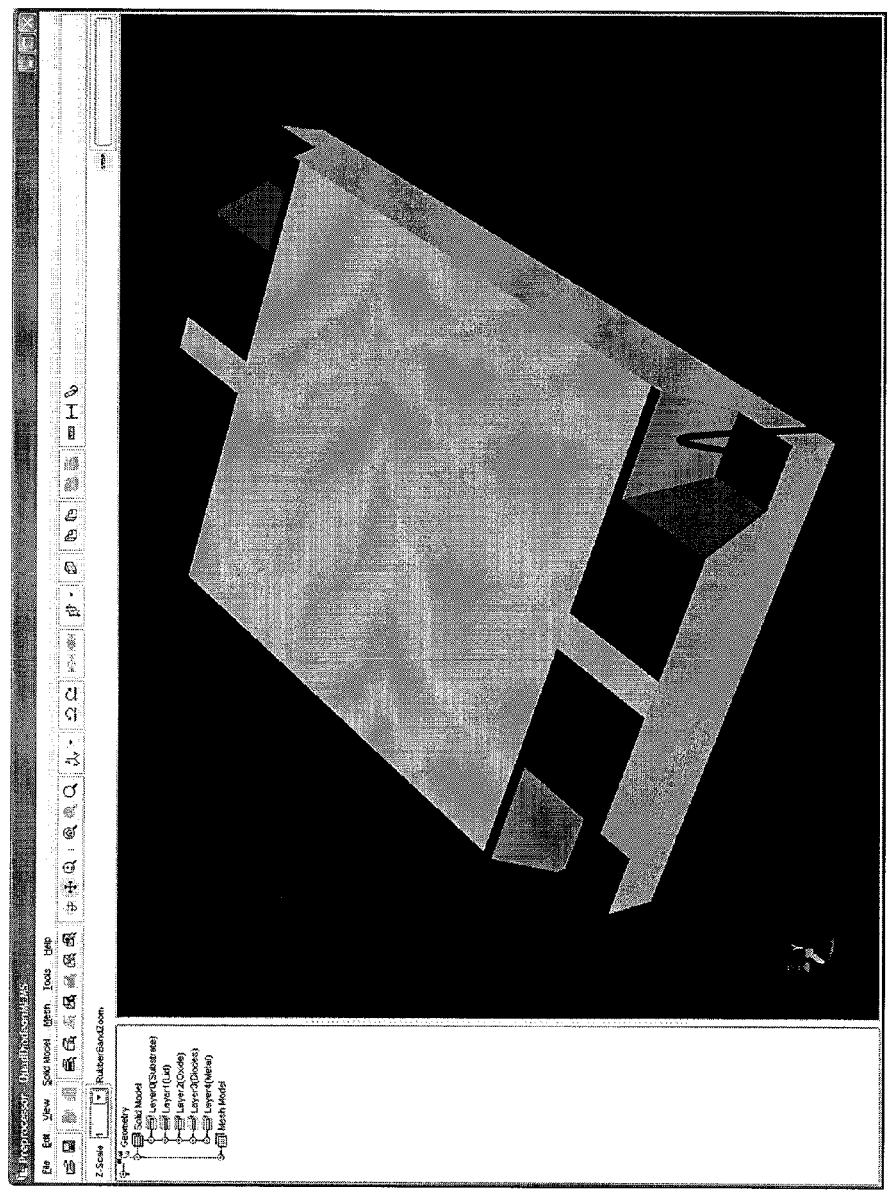
FIG. 11 is a perspective view of an embodiment of the present invention with a quad diode on a MEMS system without wire bonding from the lid to the core.

FIG. 11 is a perspective view of a quad diode on a MEMS system 10 of the present invention without wire bonding from the lid to the core. Separate wires connect the ESD protected MEMS device to a circuit board or other suitable substrate.

Other embodiments of the invention will be apparent to those skilled in the art from consideration of the specification and practice of the invention disclosed herein. It is intended that the specification and examples be considered as exemplary only, with a true scope and spirit of the invention being indicated by the appended claims.

The invention claimed is:

1. A MEMS system, comprising:
   a base;
   a semiconductor core including a MEMS device;
   an electronic circuitry in the core;
   a lid; and
   an ESD protection device coupled to the lid and to the electronic circuitry, wherein the ESD protection device and the MEMS device are in separate wafers and the ESD protection device is integrated with the MEMS device to provide ESD protection to the MEMS device at the instant fabrication of the MEMS device is completed.

2. The system of claim 1, wherein the MEMS device is selected from at least one of, a sensor 18, an actuator and electronic circuitry.

3. The system of claim 1, wherein the MEMS system provides for at least one of, integration of signal conditioning and integration of electronic circuitry.

4. The system of claim 1, wherein the electronic circuitry is selected from at least one of, an amplifier, a filter, an A/D converter, an ASIC, a DSP, and a microprocessor.

5. The system of claim 1, wherein the ESD protection device 22 is included in the lid.

6. The system of claim 1, wherein the ESD protection device is one or more diodes.

7. The system of claim 6, wherein the at least one or more diodes are diodes with a common point where ESD energy is diverted.

8. The system of claim 6, wherein four p-n junction diodes are connected together at one end to a common point with each diode being coupled to a terminal of the MEMS device.

9. The system of claim 1, further comprising:
   vias formed in the lid 16 with metal in the vias that couple the ESD protection device with the electronic circuit.

10. The system of claim 1, wherein further comprising:
    a trim resistor network in the lid to provide for trimming of zero offset of the MEMS device.

11. The system of claim 10, further comprising:
    one or more resistors to allow for zero offset trimming.

12. The system of claim 1, wherein a signal conditioning circuit is fabricated into the lid.

13. The system of claim 1, wherein the MEMS device is selected from at least one of a, piezoresistive pressure sensor, accelerometer sensor, inclinometer, geophone, microphone, gyroscope, flow sensor, displacement sensor, force sensor, torque sensor, stress and strain sensor.

* * * * *